(12) United States Patent
Vincent et al.

(10) Patent No.: US 9,831,374 B2
(45) Date of Patent: Nov. 28, 2017

(54) PHOTODETECTOR WITH TAPERED WAVEGUIDE STRUCTURE

(71) Applicant: Intel Corporation, Santa Clara, CA (US)

(72) Inventors: Benjamin Vincent, San Francisco, CA (US); Avi Feshali, Los Angeles, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/038,445

(22) PCT Filed: Dec. 20, 2013

(86) PCT No.: PCT/US2013/077313
§ 371 (c)(1),
(2) Date: May 20, 2016

(87) PCT Pub. No.: WO2015/094377
PCT Pub. Date: Jun. 25, 2015

(65) Prior Publication Data
US 2016/0300972 A1    Oct. 13, 2016

(51) Int. Cl.
*H01L 31/0232* (2014.01)
*H01L 31/105* (2006.01)
(Continued)

(52) U.S. Cl.
CPC .......... *H01L 31/105* (2013.01); *G02B 6/1228* (2013.01); *H01L 31/028* (2013.01);
(Continued)

(58) Field of Classification Search
CPC ......... H01L 31/022408; H01L 31/0232; H01L 31/03529; H01L 31/03921; H01L 31/103; H01L 31/108; H01L 31/153
(Continued)

(56) References Cited

U.S. PATENT DOCUMENTS

| 5,391,869 A | 2/1995 | Ade et al. |
| 6,808,957 B1 | 10/2004 | Ho et al. |

(Continued)

FOREIGN PATENT DOCUMENTS

| CN | 100440522 | 12/2008 |
| CN | 102116913 | 7/2011 |

(Continued)

OTHER PUBLICATIONS

International Preliminary Report on Patentability PCT Application No. PCTUS2013/077313 dated Jun. 30, 2016, 7 pages.

(Continued)

*Primary Examiner* — Long K Tran
(74) *Attorney, Agent, or Firm* — Blakely, Sokoloff, Taylor & Zafman LLP

(57) ABSTRACT

Techniques and mechanisms for providing efficient direction of light to a photodetector with a tapered waveguide structure. In an embodiment, a taper structure of a semiconductor device comprises a substantially single crystalline silicon. A buried oxide underlies and adjoins the monocrystalline silicon of the taper structure, and a polycrystalline Si is disposed under the buried oxide. During operation of the semiconductor device light is redirected in the taper structure and received via a first side of a Germanium photodetector. In another embodiment, one or more mirror structures positioned on a far side of the Germanium photodetector may provide for a portion of the light to be reflected back to the Germanium photodetector.

11 Claims, 10 Drawing Sheets

(51) Int. Cl.
  *G02B 6/122* (2006.01)
  *H01L 31/028* (2006.01)
  *H01L 31/18* (2006.01)
  G02B 6/42 (2006.01)
  G02B 6/12 (2006.01)

(52) U.S. Cl.
  CPC .... *H01L 31/02327* (2013.01); *H01L 31/1804* (2013.01); *G02B 6/4295* (2013.01); *G02B 2006/121* (2013.01); *Y02E 10/52* (2013.01)

(58) Field of Classification Search
  USPC .......................................................... 257/432
  See application file for complete search history.

(56) References Cited

U.S. PATENT DOCUMENTS

| 2005/0110108 A1 | 5/2005 | Patel et al. |
| 2007/0105256 A1* | 5/2007 | Fitzgerald ......... H01L 21/76254 438/34 |
| 2008/0105940 A1 | 5/2008 | Piede et al. |
| 2011/0156183 A1 | 6/2011 | Liu |
| 2013/0177274 A1 | 7/2013 | Kosenko |

FOREIGN PATENT DOCUMENTS

| JP | 2003511737 | 3/2003 |
| JP | 2013513825 | 4/2013 |

OTHER PUBLICATIONS

"PCT, International Search Report and Written Opinion of the International Searching Authority for International Application No. PCT/US2013/077313", dated (Sep. 29, 2014), Whole Document.
First Office Action for Chinese Patent Application No. 201380081086.9 dated Dec. 30, 2016, 5 pgs., no English translation.
Non-Final Office Action from Japanese Patent Application No. 2016-536199 dated Apr. 25, 2017, 4 pgs.
Vivien, Laurent , et al., "Zero-bis 40Gbit/s germanium waveguide photodetector on silicon", vol. 20, No. 2 (2012), pp. 1096-1101.
EP Appln. No. 12899668.1 Search Report Aug. 24, 2017, 7 pgs.

* cited by examiner

PHOTODETECTOR WITH TAPERED WAVEGUIDE STRUCTURE

CROSS-REFERENCE TO RELATED APPLICATION

This patent application is a U.S. National Phase Application under 35 U.S.C. §371 of International Application No. PCT/US2013/077313, filed Dec. 20, 2013, entitled PHOTODETECTOR WITH TAPERED WAVEGUIDE STRUCTURE.

BACKGROUND

1. Technical Field

Embodiments of the invention are generally related to optical circuits, and more particularly to a photodetector circuit with a tapered waveguide.

2. Background Art

The speed of a Germanium photodetector (PD) is typically affected by the resistance-capacitance (RC) characteristics of its contact area and the associated transit time for carriers generated by the PD to migrate from an intrinsic Ge zone to n-doped or p-doped contact areas. Although there is a general interest in scaling down a PD for improved speed, this interest is offset by the need to provide a large enough region for sufficient light absorption within the PD.

The dimension of a Ge PD along a direction of traveling light—such as a length of a waveguide Ge PD—is typically directly related to the area of the PD's p-i-n junction and to the region available for capturing light. If this dimension is too small, PD responsivity is impacted. As a result, this PD dimension is constrained by a minimum required value, which is usually wavelength dependent. Moreover, in the case of a Ge PD associated with a waveguide, PD size reduction is often constrained by an attendant need to reduce Si waveguide dimensions for coupling with the Ge PD input. Such scaling of the Si waveguide dimension makes coupling of light more challenging and could increase the loss of the waveguide.

For at least these reasons, photodetector scaling poses a challenge for improving the speed of optical communications. As successive generations of optics technology continue to scale in terms of data rates, there is an increasing desire for structures and fabrication techniques which provide for efficient and responsive photodetection.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
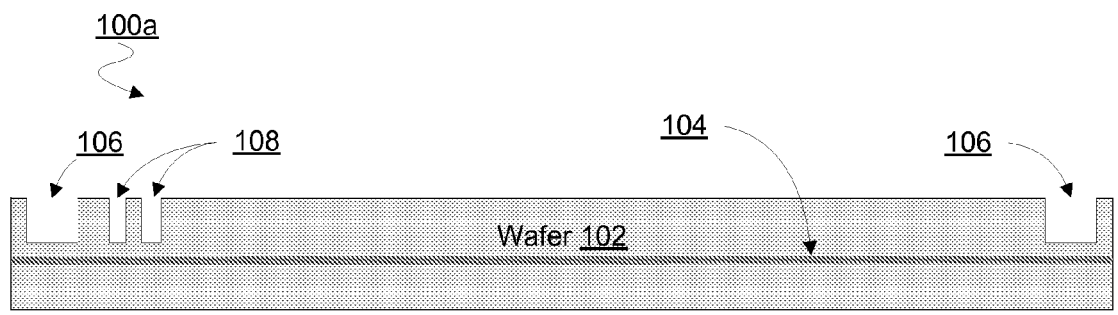
FIGS. 1A-1M are cross-sectional diagrams each illustrating elements of a respective stage of a process for fabricating a semiconductor device according to an embodiment.

Embodiments discussed herein variously provide techniques and/or mechanisms for efficient direction of light with a waveguide structure for absorption in a photodetector region. Improved light coupling at a photodetector input may be achieved according to an embodiment with a tapered waveguide structure characterized by an input and an output of different respective dimensions. A taper structure of a semiconductor device may comprise a substantially single crystalline silicon. Although such a silicon is referred to herein as "monocrystalline," one of ordinary skill will appreciate that a low level of crystal defects may nevertheless be present—e.g. as artifacts of an imperfect epitaxial growth process. A thickness of the taper structure may decrease along a length of the semiconductor device. Alternatively or in addition, a width of the taper structure may decrease along the length of the semiconductor device.

In an embodiment, a first buried oxide (BOX) may underlie and adjoin the monocrystalline silicon (mono-Si) of such a taper structure. The first BOX may further form a trench in which is disposed additional monocrystalline silicon. Germanium of a Ge PD may be disposed over such a trench to receive light directed with the taper structure. For example, the Ge PD may extend at least to a depth of a top surface of the first BOX which is underneath the waveguide, thereby reducing the possibility of light being directed under the Ge PD.

One or more mirror structures may be disposed on a side of the Ge PD which is opposite a side that is to serve as an input of the Ge PD. The one or more mirror structures may provide for double pass of light back into the Ge PD. The one or more mirror structures may provide for the different respective refractive indices of two materials to serve as a Bragg grating reflector which, for example, comprises a periodic structure of interleaved Si portions and $SiO_2$ portions—e.g. the periodic structure including two periods of $SiO_2$. In some embodiments, a polycrystalline Si (poly-Si) may be disposed under the first BOX—e.g. where a second BOX is disposed under the poly-Si. Such a poly-Si may provide for improved stress response characteristics—e.g. as compared to thick oxide deposition.

Certain embodiments include a process to fabricate such a semiconductor device. In an embodiment, fabrication of a taper structure includes growing a mono-Si epitaxy (EPI) on a silicon-on-insulator (SOI) wafer. One or more recesses may be etched or otherwise formed in such a mono-SI EPI—e.g. where such recesses provide for the formation of mirror structures, alignment structures and/or the like. In an embodiment, engineered waveguide structures may be etched or otherwise formed in the mono-Si EPI. Such engineered structures may include a taper structure and, in one some embodiments, trench Si which is to underlie a Ge PD. After formation of such engineered waveguide structures, oxide deposition may be performed to form the first BOX. In some embodiments, a portion of the SOI wafer may be ground, split or otherwise removed to expose engineered waveguide structures for additional deposition, doping and/ or other fabrication processing.

FIGS. 1A-1M show cross-sectional views for various stages of a process to fabricate a photodetection device according to an embodiment. The process represented by FIGS. 1A-1M is illustrative of one example of processing in which engineered Si structures are formed on a SOI substrate, wherein BOX structures adjoin such Si structures to provide for efficient direction of light into a Ge PD. Referring now to FIG. 1A, a wafer 102 may be prepared for the formation of waveguide and photodetector structures with various additive and/or subtractive fabrication processes. Wafer 102 may comprise a substrate of bulk Si which includes, or is implanted or otherwise processed to include, a barrier layer 104. Barrier layer 104 may be a SiGe layer or a H implant layer which, for example, is to facilitate removal of a portion of wafer 102 in subsequent processing. In an embodiment, barrier layer 104 is formed using known silicon on insulator (SOI) wafer fabrication processes.

At stage 100a, one or more recesses may be formed in a surface of wafer 102. By way of illustration and not limitation, one or more recesses—represented by the illustrative recesses 108—may be etched in wafer 102 to provide for the subsequent formation of one or more light reflection (or "mirror") structures. In an embodiment, a depth of recesses 108 into wafer 102 is on the order of—e.g. at least equal to—a thickness of a Ge PD which is to be formed near recesses 108. By way of illustration and not limitation, recesses 108 may have a depth which is at least the same as that of a waveguide structure which is to eventually adjoin the recess 108, although such a depth may vary according to implementation-specific details. Although certain embodiments are not limited in this regard, recesses 106 may be further etched or otherwise formed in wafer 102. Recesses 106 may serve at least in part as alignment structures, for example, to aid in subsequent positioning of the semiconductor device.

Figure 1B:
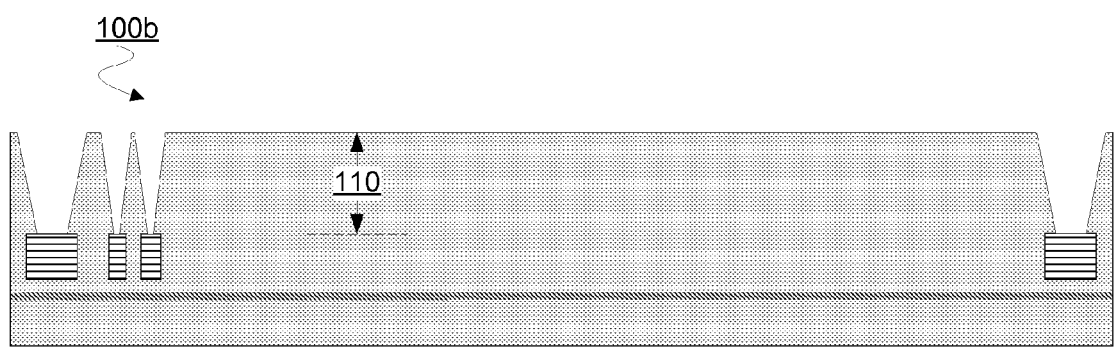
Figure 1C:

Referring now to FIG. 1B, a monocrystalline Si epitaxy 110 may be grown on wafer 102. Growth of mono-Si EPI 110 may be adapted from conventional epitaxial growth techniques, which are not limiting on certain embodiments. The details of such conventional growth techniques are not discussed herein to avoid obscuring details of certain embodiments. Prior to the growth of mono-Si EPI 110 some or all of recesses 106, 108 may be filled with an oxide or other suitable material to serve as a growth mask. As shown in stage 100c of FIG. 1C, dry etching and/or other such processing of mono-Si EPI 110 may be performed to selectively form patterns 114, 116 which expose some or all of recesses 106, 108. Such processing may further remove some or all oxide or other mask material in recesses 106, 108, although certain embodiments are not limited in this regard.

Figure 1D:
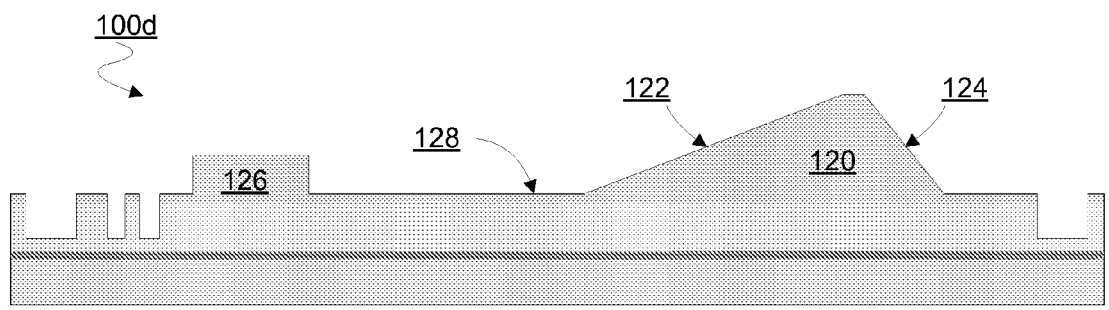

Referring now to FIG. 1D, a stage 100d is shown wherein structures are variously formed out of mono-Si EPI 110. Some or all such structures may be formed by selective subtractive processing which, for example, may be adapted from one or more conventional lithography and etching techniques. For example, such structures may include a taper structure 120 which extends from a surface 128 of the moni-Si material. In an embodiment, taper structure 120 may be formed from mono-Si EPI 110 by performing a mesa etch and further applying gray-scale lithography/etching to form sides 122, 124. Taper structure 120 may be configured to facilitate operation of the semiconductor device for collecting and directing light into a photodetector region. By way of illustration and not limitation, taper structure may extend to a height of up to a few 10 s of microns (e.g. 60 microns) over surface 128. Alternatively or in addition, sides 122, 124 of taper structure 120 may have respective angles of 85° and 45°, as measured from a line normal to surface 128. However, such height and angle values are merely illustrative of one embodiment, and may vary according to implementation-specific details.

Alternatively or in addition, etching processes to expose surface 128 may be selective masked to form a silicon structure referred to herein as trench silicon 126. As discussed herein, trench silicon 126 may, in an embodiment, reside within a trench structure over which is disposed some or all of a Ge PD. Mono-Si material between trench silicon 126 and taper structure 120—e.g. the material forming surface 128—may serve as a waveguide structure for directing light from taper structure into such a Ge PD. The providing of trench silicon 126 may facilitate improved collection of light by the Ge PD.

Figure 1E:
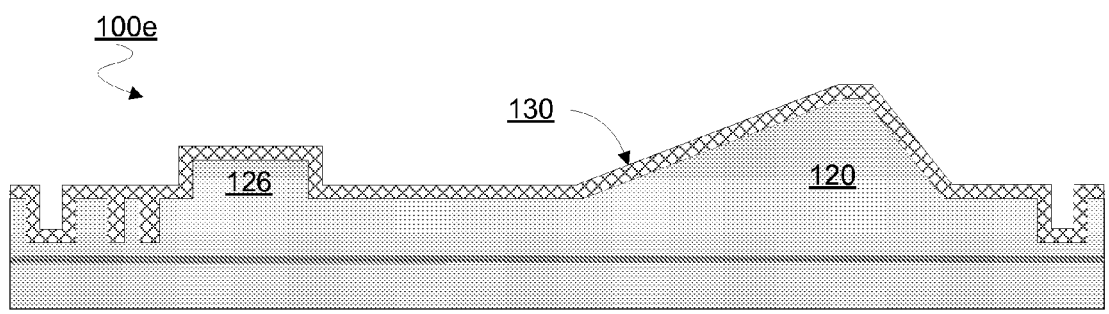

Referring now to FIG. 1E, a stage 100e is shown wherein an oxide material 130 such as $SiO_2$ is sputtered or otherwise deposited onto mono-Si structures including trench Si 126, surface 128 and taper structure 120. Formation of oxide material 130 may include oxidizing the wafer surface to form an initial oxide seed layer for subsequent oxide deposition—e.g. according to conventional oxidation techniques. The oxide material 130 may later serve as part of a buried oxide (BOX) layer of the semiconductor device. In one embodiment, deposition of oxide material 130 over trench silicon 126 results in oxide material 130 forming a trench structure. Alternatively or in addition, the oxide material 130 may fill some or all of recesses 108 to variously form one or more mirror structures for redirecting light back into a Ge PD of the semiconductor device.

Figure 1F:
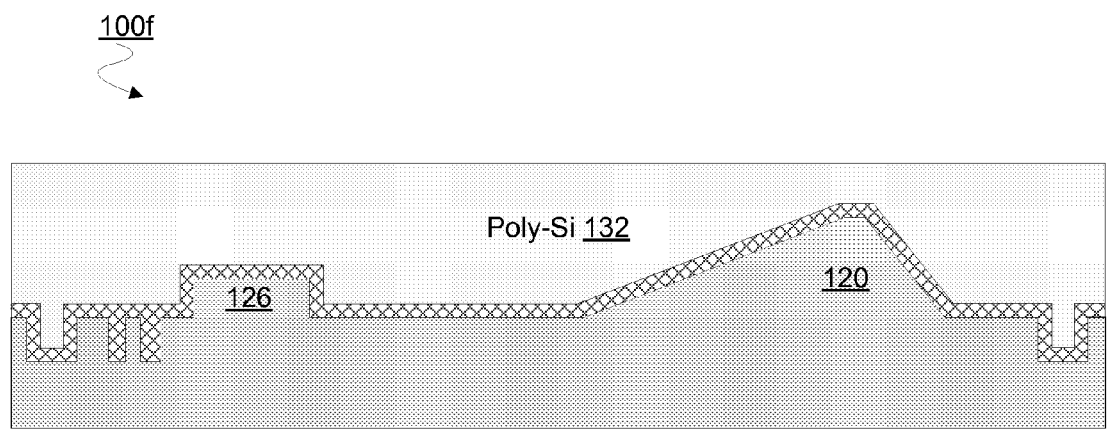
Figure 1G:
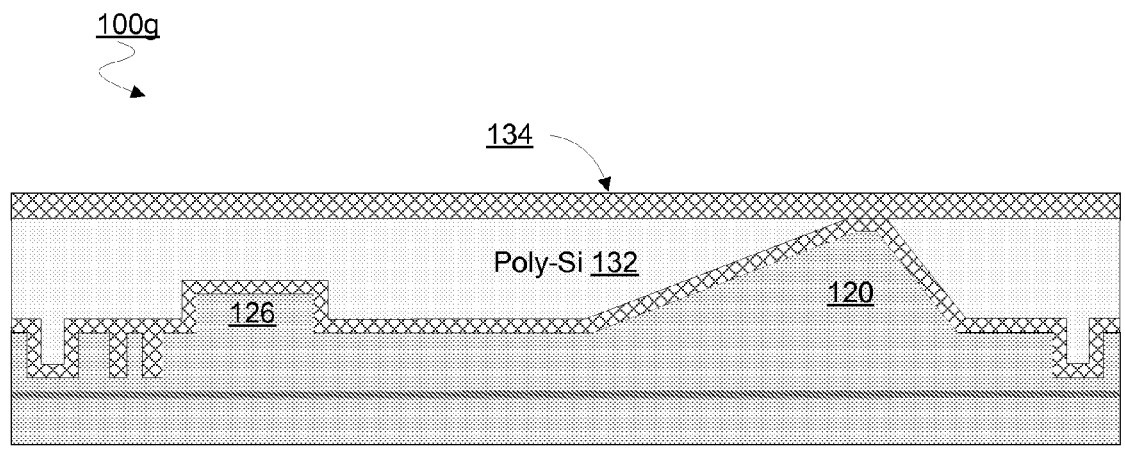

Referring now to stage 100f of FIG. 1F, a polycrystalline silicon (poly-Si) 132 may be sputtered or otherwise deposited onto oxide material 130. Poly-Si 132 may provide a low stress interface between oxide material 130 and other structures of the semiconductor device. In one embodiment, poly-Si 132 is at least thick enough to extend over a height of taper structure 120 above surface 128. For example, poly-Si 132 may be at least 20 um thick, although certain embodiments are not limited in this regard.

Additional oxide material may be disposed onto poly-Si 132 to provide a second buried oxide layer of the semiconductor device. For example, as shown by stage 100g in FIG. 1G, portions of poly-Si 132 may be ground, polished or otherwise planarized—e.g. with chemical-mechanical polishing (CMP)—to provide a level surface for an oxide material 134 such as $SiO_2$. In an embodiment, planarization of poly-Si 132 exposes a portion of oxide material 130 for contact with the deposited oxide material 134.

The formation of tapered structure 120 and the buried oxide structures of stage 100g may be contrasted, for example, with existing waveguide fabrication techniques. Conventionally, buried taper structures are typically obtained by etching a deep (e.g. 30 um) cavity through an insulating layer of an SOI, depositing a conformal oxide layer within such a cavity, and filling the cavity by depositing Si therein. However, in these conventional techniques, such Si growth is simultaneous on various surfaces and edges in or around the cavity, resulting in formation of poly-Si in the cavity. By contrast, certain embodiments are based on a realization that optical characteristics of a tapered structure are improved with mono-Si, and/or a realization of techniques for providing such mono-Si of a tapered structure. At least one advantage of certain embodiments is that a comparatively low-stress poly-Si 132 avoids stress and cracking issues which arise with thick BOX structures of conventional semiconductor device architectures.

Figure 1H:
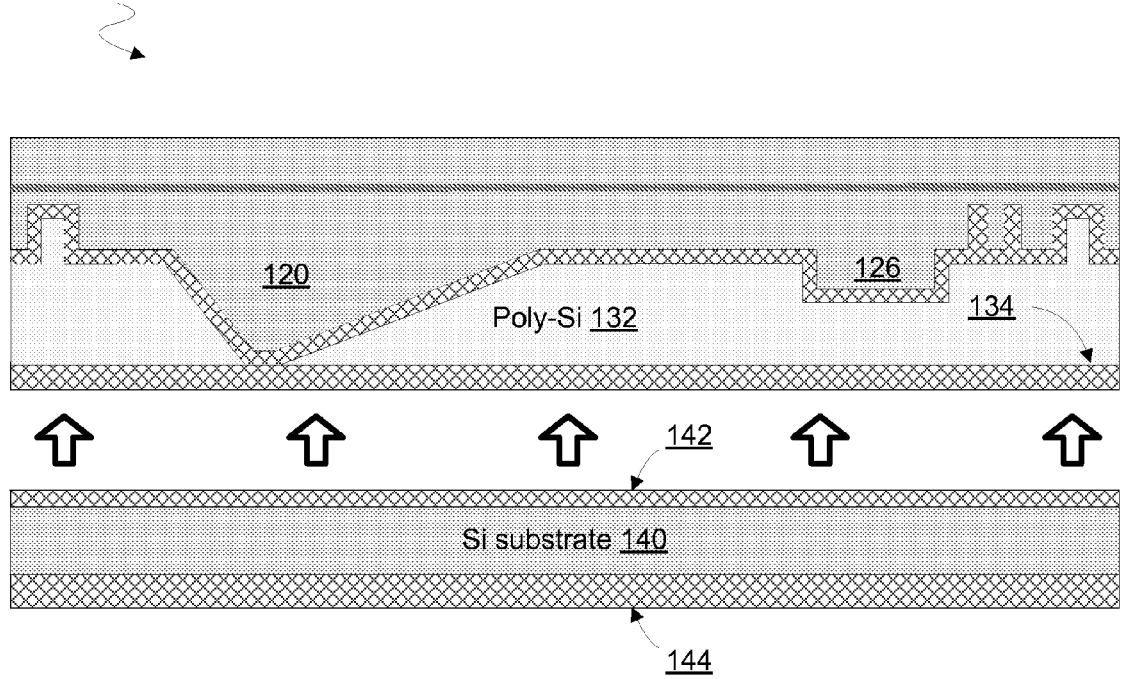

In an embodiment, the processed wafer of state 100g may be bonded to a handling wafer in preparation for additional processing. Referring now to FIG. 1H, such a handling wafer may include a silicon substrate 140 and an oxide material 144 such as $SiO_2$. The handling wafer may be bonded to the processed wafer of stage 100g via oxide material 134—e.g. where additional oxide material 142 disposed on Si substrate 140 provides for oxide bonding of the handling wafer to oxide material 134.

Figure 1I:
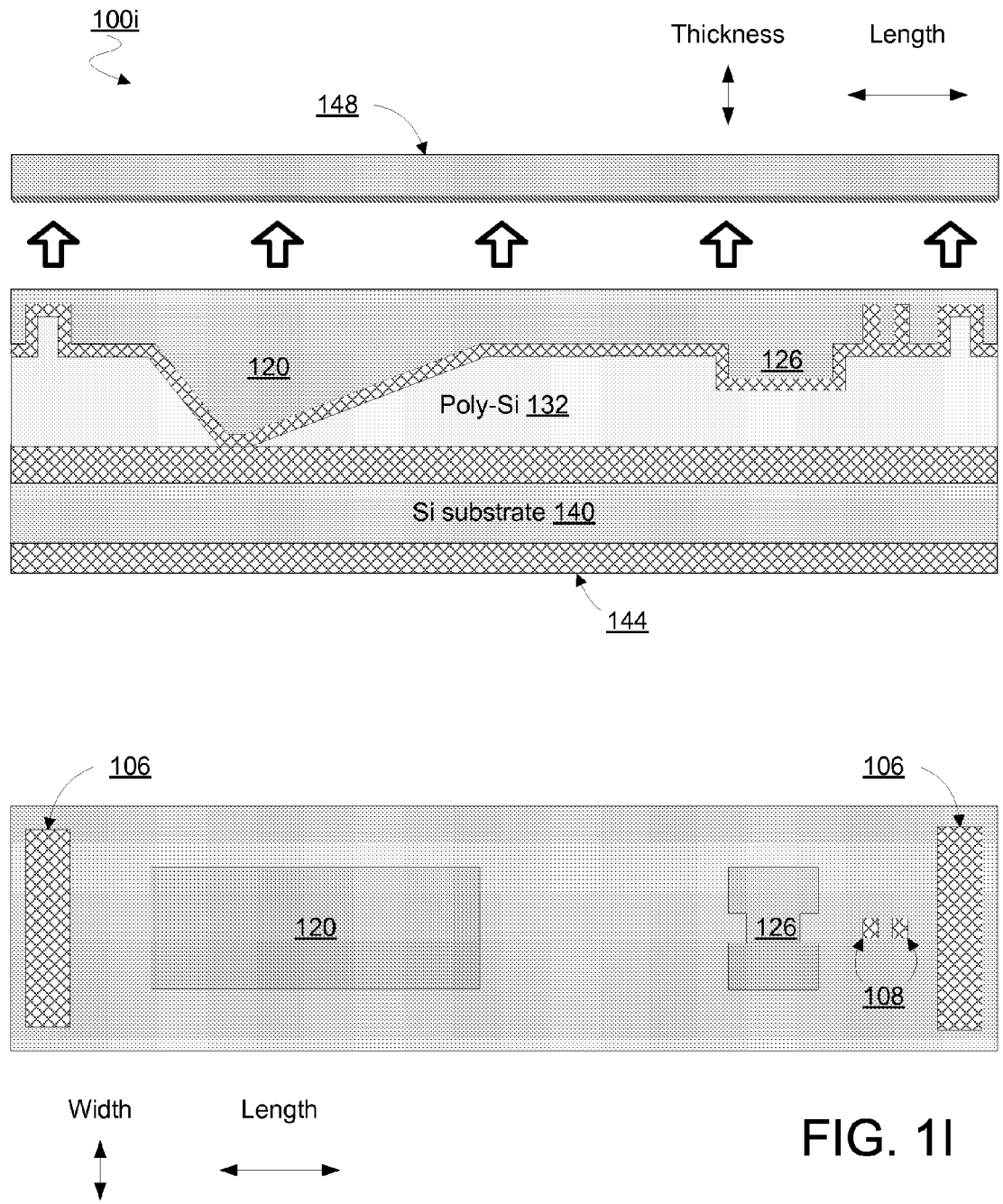
Figure 1J:
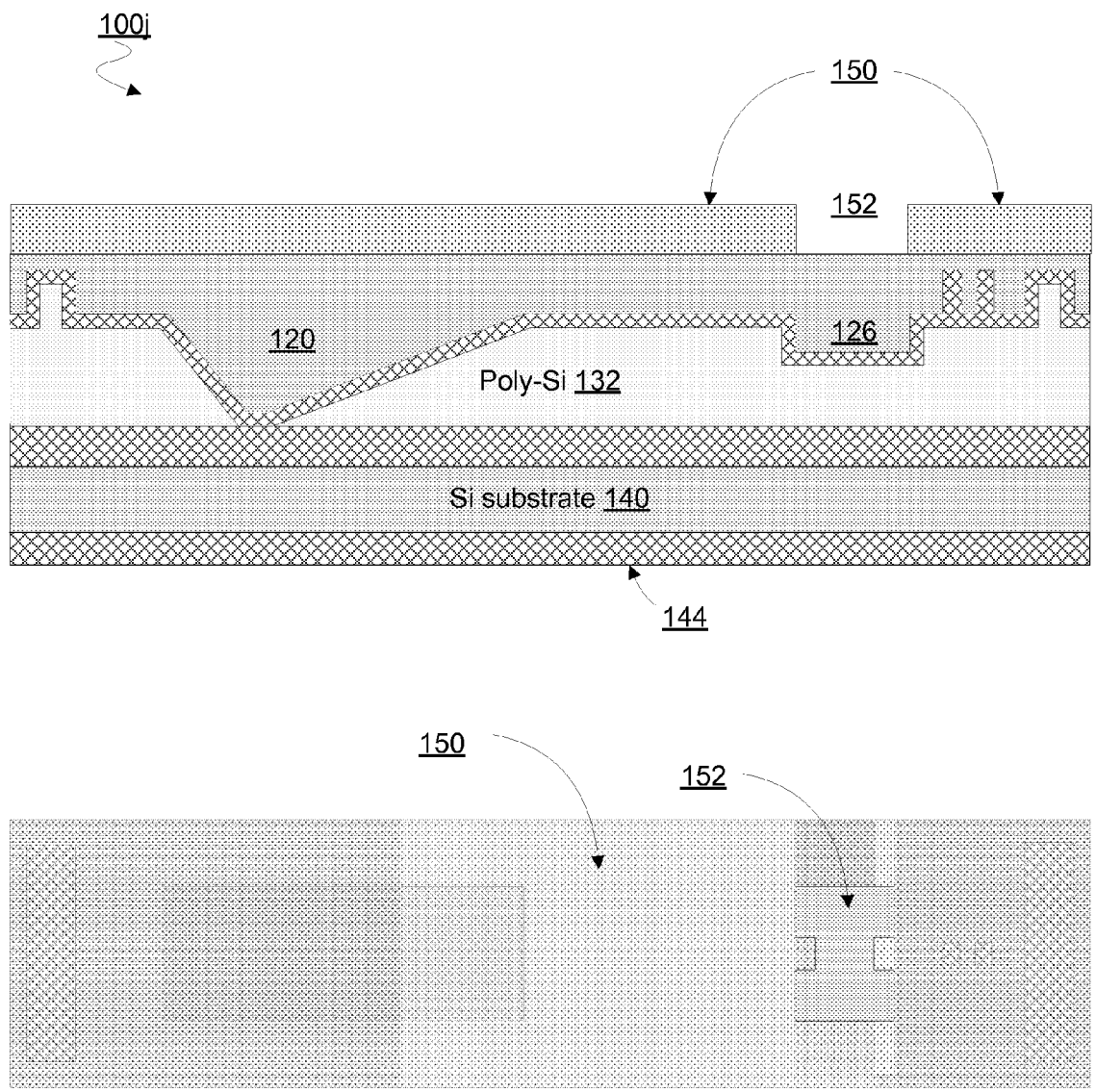
Figure 1K:
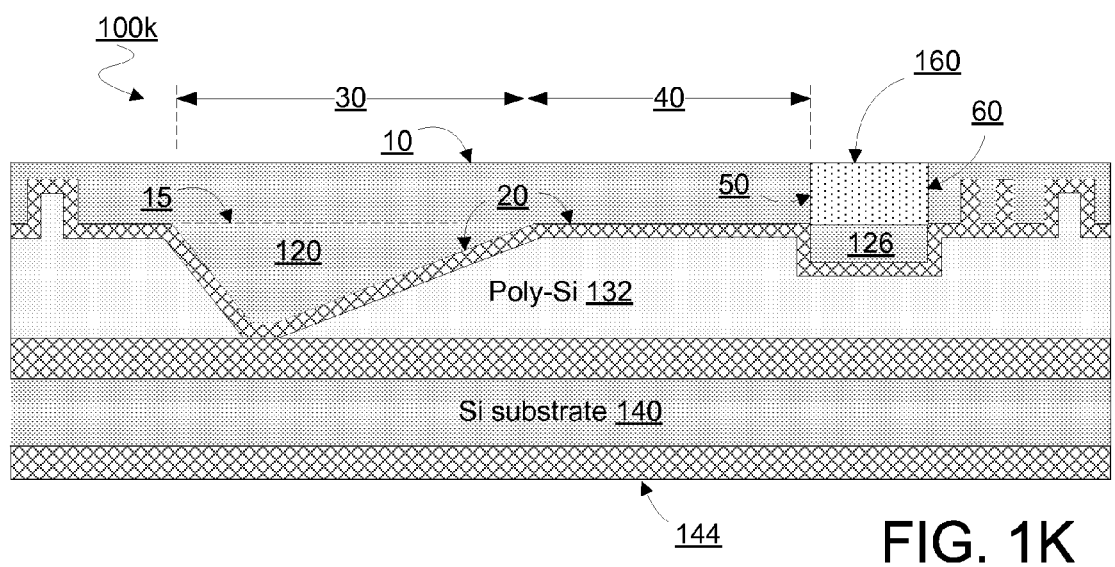

After bonding, a portion 148 of the Si substrate of wafer 102 may be removed, as shown in stage 100i of FIG. 1I. The removal of portion 148 may be achieved, for example, with grinding, backside etch removal (using SiGe of barrier layer 104 as a stop etch), a wafer split (using an H implanted barrier layer 104 for smart cut processing) and/or other such subtractive processing. The mono-Si exposed by removal of portion 148 may then be polished or otherwise planarized, in an embodiment. FIG. 1I shows both a cross-sectional side view and a cross-sectional top view of photodetection structures and waveguide structures at stage 100*i*. For reference, the respective dimensions for thickness, length and width of such structures is also shown.

After removal of portion 148, and any preparation of the mono-Si material exposed by such removal, deposition and doping processes may be performed to form a Ge PD. For example, referring now to FIG. 1J, a patterned mask—represented by the illustrative hard mask 150—may be formed on a top surface of the (inverted) mono-Si material. Hard mask 150 may include, for example, SiC, SiON, TiN, carbon or any of a variety of other organic or inorganic mask materials known in the art.

In an embodiment, hard mask 150 includes a pattern which forms a cavity 152 extending through hard mask 150. Although certain embodiments are not limited in this regard, cavity 152 may include portions having different respective total lengths and/or different respective total widths. By way of illustration and not limitation, a cross-sectional profile of cavity 152 may form have a dumbbell, hourglass or other such shape which defines lobe portions and at least one comparatively narrow "neck" portion between such some or all such lobe portions. An example, of one such cross-sectional profile is shown in the top view of FIG. 1J.

A portion of mono-Si may be selectively removed through cavity 152—e.g. by a dry etch, wet etch, in-situ etch in an EPI reactor, or the like—to expose trench silicon 126. Germanium may then be selectively grown onto mono-Si which is exposed by such etching. For example, at stage 100*k* shown in FIG. 1K, a region 160 of germanium is formed in the region above trench silicon 126. The region 160 may extend at least to a depth of the first BOX formed with oxide material 130. Accordingly, region 160 may be adjacent to Si on each of its sides 50, 60 (and, in an embodiment, a bottom side). In an embodiment, Ge may be non-facetted (or substantially so) throughout region 160, since such Ge is not grown on any oxide wall. The Ge of region 160 may be initially overgrown and subsequently planarized—e.g. by a CMP process. Hard mask 150 may be subsequently removed, as shown at state 100*k*.

Figure 1L:
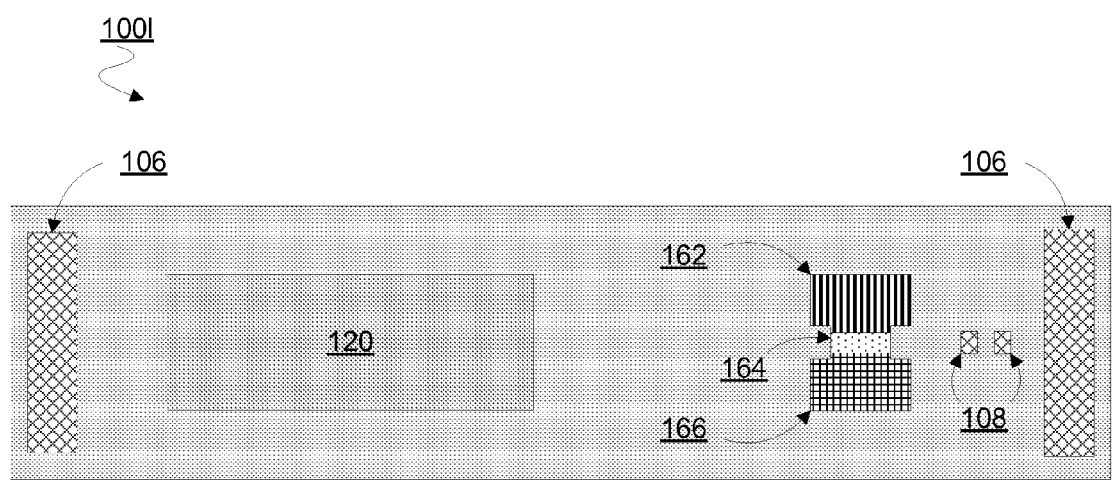

Referring now to FIG. 1L, a stage 100*l* is shown wherein doping of different portions of region 160 is selective performed to create various respective regions of the Ge PD. In an embodiment, such doping forms a p-doped Ge region 162 and an n-doped Ge region 166 each on a respective side of an intrinsic Ge region 164. In an embodiment, some or all such doping may be masked at least in part by hard mask 150. Alternatively, such doping may take place with a different mask or series of masks after removal of hard mask 150. Regions 162, 164, 166 may provide a PIN junction for operation as a photodiode to generate current in response to light which is directed from taper structure 120 toward region 164.

Figure 1M:
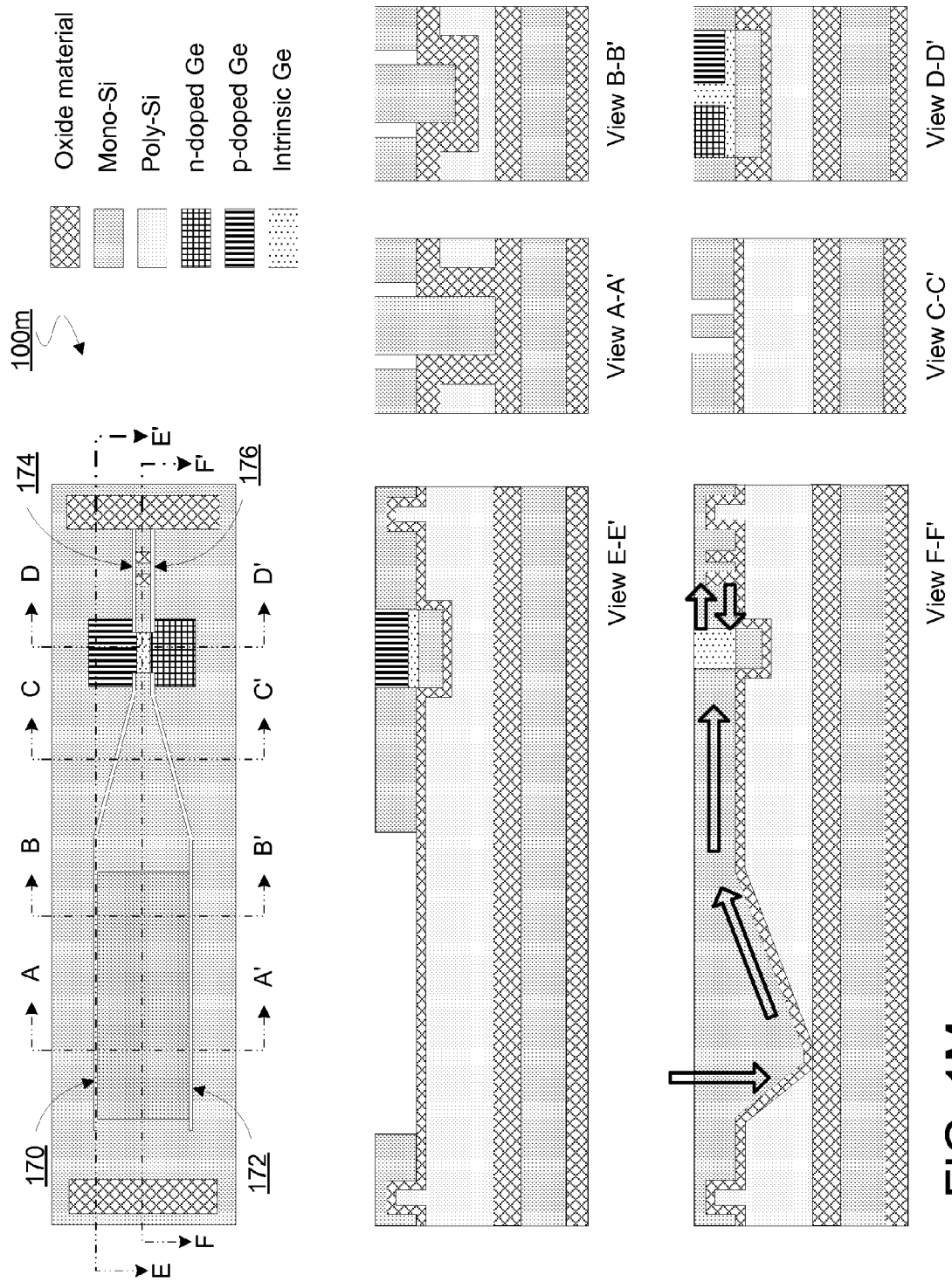

Referring now to FIG. 1M, a stage 100*m* is shown wherein trenches 170, 172 are etched or otherwise formed in the mono-Si material—e.g. where respective portions of trenches 170, 172 extend along or over opposite sides of taper structure 120. Trenches 170, 172 may extend through the mono-Si to the underlying first BOX layer which is over poly-Si 132. Although certain embodiments are not limited in this regard, a distance separating trenches 170, 172 may decrease along the length of the semiconductor device—e.g. wherein at the Ge PD, a separation of trenches 170, 172 from one another is equal to a width of region 164. Alternatively or in addition, other waveguide trenches—represented by the illustrative trenches 174, 176, may be etched or otherwise formed on a far side 60 of the Ge PD. Trenches 174, 176 may contain light which initially escapes from region 164 without being absorbed. For example, this light may be reflected back toward region 164 by one or more mirror structures such as those formed in recesses 108.

FIG. 1M shows lateral cross-sectional views A-A, B-B, C-C, D-D and longitudinal cross-sectional views E-E, F-F of the semiconductor device at stage 100*m*. In view F-F', arrows are shown to illustrate how light is collected and directed from taper structure 120 through a waveguide portion over surface 128 toward the Ge PD which is disposed above trench silicon 126. The configuration of the semiconductor device provides for effective collection and concentration of such light toward the Ge PD. In an embodiment, efficient collection and direction of highly concentrated light into the Ge PD is achieved at least in part with taper structure 120 and its monocrystalline Si. Alternatively or in addition, such efficient light collection and direction may be achieved with one or more mirror structures—such as those formed in recesses 108—positioned to reflect unabsorbed light back from a far side of the Ge PD. Alternatively or in addition, such efficient light collection and direction may be achieved with a narrowing of the distance between trenches 170, 172 toward the input of the Ge PD.

Figure 2:
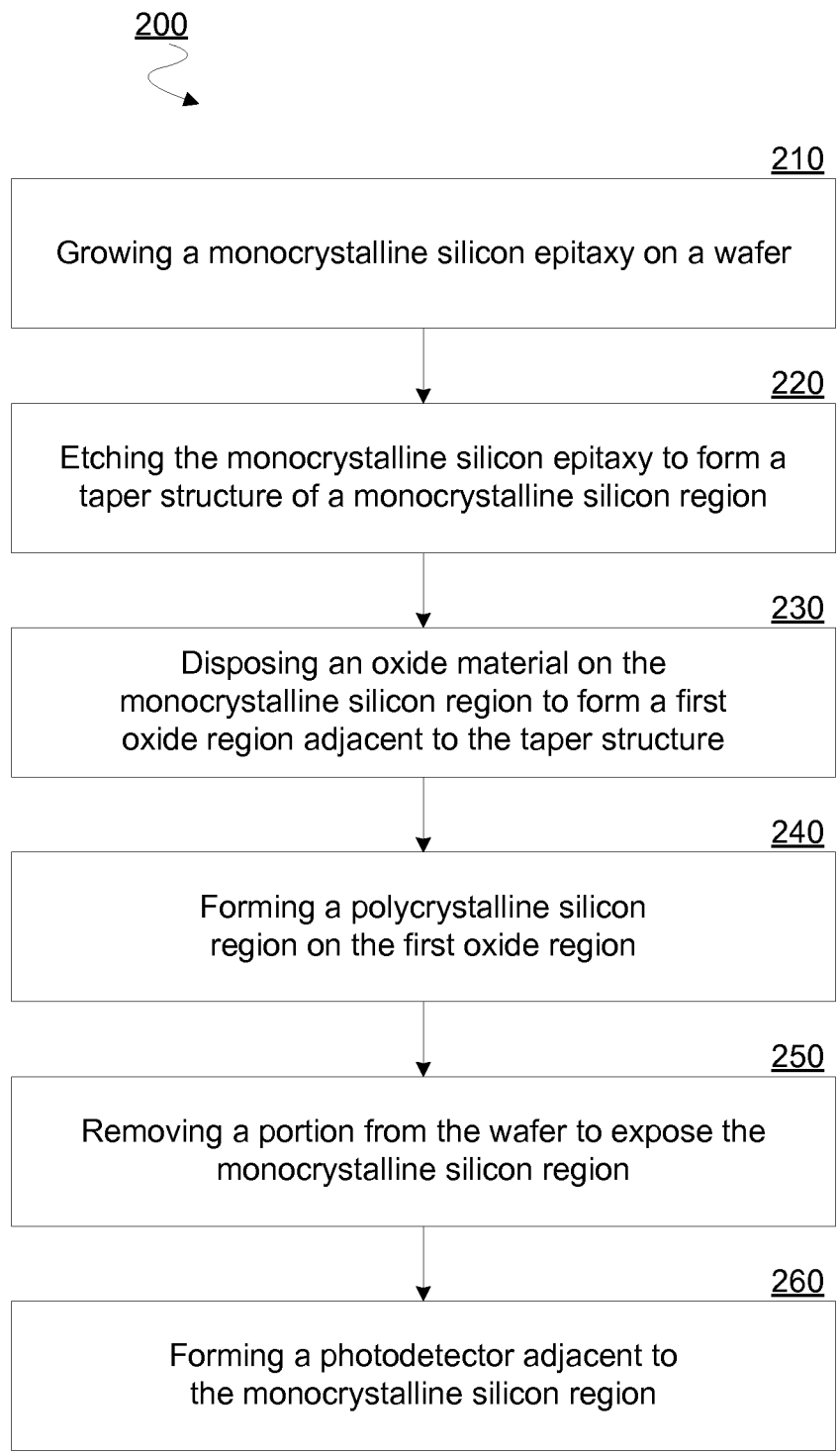
FIG. 2 is a flow diagram illustrating elements of a method for fabricating a semiconductor device according to an embodiment.

FIG. 2 illustrates elements of a method 200 for fabricating a semiconductor device according to an embodiment. Method 200 may include some or all of the processing operations variously represented by FIGS. 1A-1M.

In an embodiment, method 200 includes operations to form a monocrystalline silicon region which facilitates light propagation and/or redirection. Such operations may include, at 210, growing a monocrystalline silicon epitaxy on a wafer of semiconductor material which, for example, includes a buried barrier layer. The barrier layer may include SiGe which is buried in a bulk silicon substrate. Alternatively, the barrier layer may result from H ion implantation processing of such bulk silicon. Formation of the monocrystalline silicon region may further comprise, at 220, etching the monocrystalline silicon epitaxy to form a taper structure. The etching may further form a structure such as that of trench silicon 126, although certain embodiments are not limited in this regard.

In an embodiment, additional processing (not shown) of method 200 includes etching one or more recesses in the wafer—e.g. prior to growing of the monocrystalline silicon epitaxy at 210. Such one or more recesses may provide, for example, for the subsequent formation of one or more mirror structures to facilitate reflection of light back into a photodetector. Alternatively or in addition, one or more recesses may serve as alignment structures for positioning the resulting semiconductor device during subsequent assembly, packaging and/or the like.

In an embodiment, method 200 further comprises, at 230, disposing an oxide material on the monocrystalline silicon region to form a first oxide region adjacent to the taper structure. The first oxide region may, during operation of the resulting semiconductor device, provide for redirection of light in the taper structure toward a photodetector—e.g. via a waveguide region adjoining the taper structure. Method 200 may further comprise, at 240, forming a polycrystalline silicon region on the first oxide region. Formation of the polycrystalline silicon at 240 may cover the taper structure and, in some embodiments, all of the first oxide region.

After formation of the polycrystalline silicon region at 240, method 200 may perform, at 250, removing a portion from the wafer to expose the monocrystalline silicon region. In an embodiment, the portion removed at 240 includes the buried barrier layer. By way of illustration and not limitation, removing the portion of the wafer at 240 may comprise splitting the wafer at the buried barrier layer. Method 200 may further comprise, at 260, forming a photodetector adjacent to the monocrystalline silicon region. In an embodiment, the photodetector extends along a side of the monocrystalline silicon region at least to a level of an interface with the oxide material. The photodetector may extend to a top of a trench structure formed at least in part by the oxide material. For example, the trench structure may be formed at least in part by a recess of the first oxide region toward the polycrystalline silicon region, wherein a bottom side of the photodetector adjoins silicon disposed in the trench structure.

In one embodiment, method 200 further comprises operations (not shown) including etching the monocrystalline silicon region to form a first waveguide trench and a second waveguide trench. Such waveguide trenches may extend along opposite sides of the taper structure, for example. In an embodiment, a first distance between the first waveguide trench and the second waveguide trench at the photodiode is less than a second distance between the first waveguide trench and the second waveguide trench at the taper structure.

Features of a semiconductor device fabricated according to method 200 are now considered with respect to structures formed at or before stage 100k. Some or all such features may be variously characterized with reference to a plane 15 within the semiconductor device. Plane 15 may include at least a portion of an interface 20 between mono-Si material and adjoining first oxide material. For example, a section 40 of the semiconductor device may include a waveguide portion disposed between taper structure 120 and the photodiode. In section 40, a portion of interface 20 extending parallel with surface 10 may form a bottom of the waveguide portion. A side 50 of the photodiode may extend along a side of such a waveguide portion—e.g. from surface 10 at least to a depth of plane 15. The photodiode may further comprise a side 60, opposite side 50, which similarly extends along adjoining mono-Si material. Side 60 may be oriented to receive light which is reflected back toward the photodiode. In an embodiment, a bottom side of the photodiode is disposed over trench silicon 126. In a section 30 of the semiconductor device, at least a portion of taper structure 120 may extend below plane 15 (where "below" in this context refers to a direction away from a surface 10 of the mono-Si material). Mono-Si material which is disposed between plane 15 and surface 10 in section 30 may be considered part of taper structure 120, in one embodiment.

Figure 3:
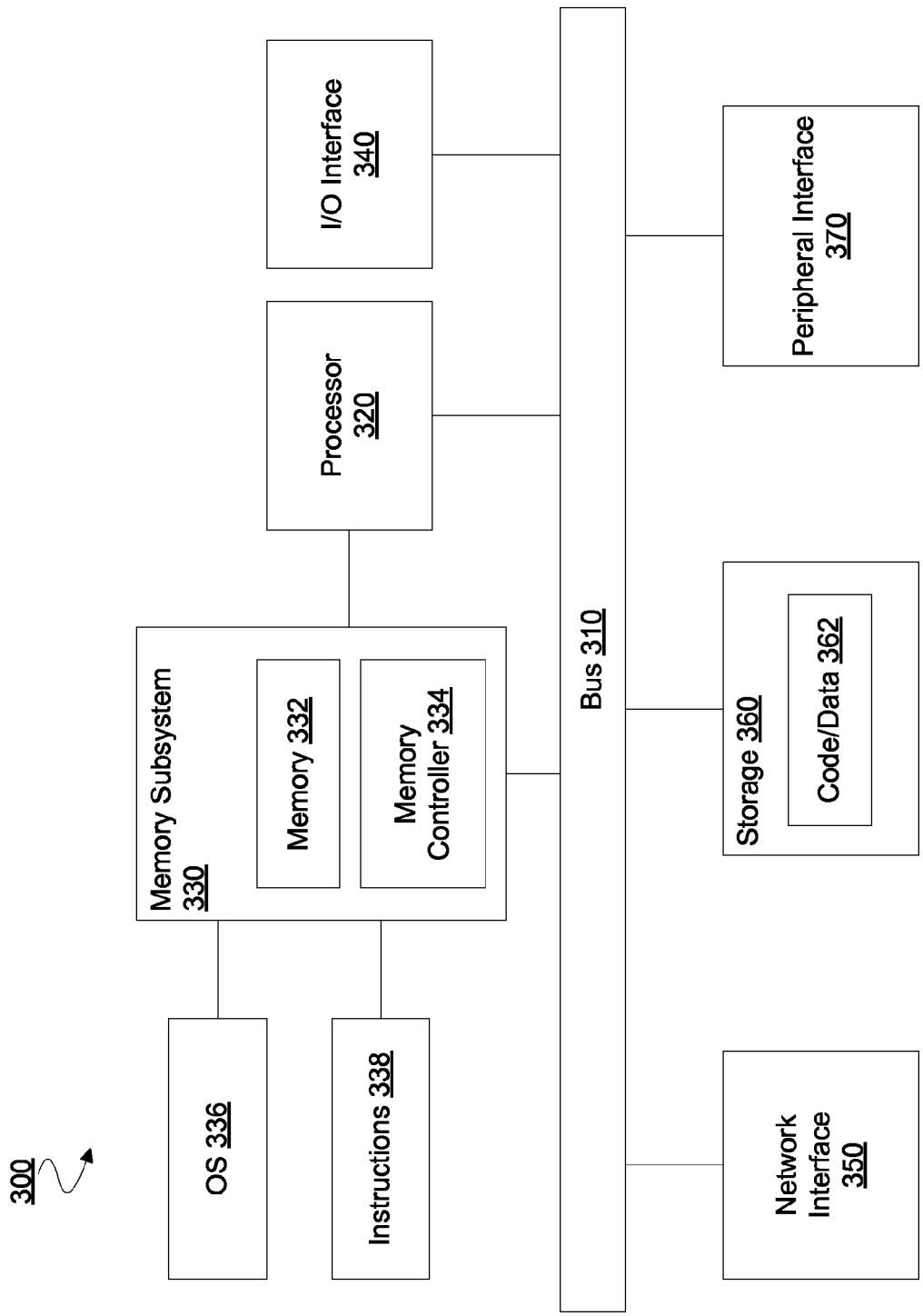
FIG. 3 is a functional block diagram illustrating elements of a computer system for detecting an optical signal according to an embodiment.

FIG. 3 is a block diagram of an embodiment of a computing system in which processing of an optical signal may be implemented. System 300 represents a computing device in accordance with any embodiment described herein, and may be a laptop computer, a desktop computer, a server, a gaming or entertainment control system, a scanner, copier, printer, or other electronic device. System 300 may include processor 320, which provides processing, operation management, and execution of instructions for system 300. Processor 320 may include any type of microprocessor, central processing unit (CPU), processing core, or other processing hardware to provide processing for system 300. Processor 320 controls the overall operation of system 300, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 330 represents the main memory of system 300, and provides temporary storage for code to be executed by processor 320, or data values to be used in executing a routine. Memory subsystem 330 may include one or more memory devices such as read-only memory (ROM), flash memory, one or more varieties of random access memory (RAM), or other memory devices, or a combination of such devices. Memory subsystem 330 stores and hosts, among other things, operating system (OS) 336 to provide a software platform for execution of instructions in system 300. Additionally, other instructions 338 are stored and executed from memory subsystem 330 to provide the logic and the processing of system 300. OS 336 and instructions 338 are executed by processor 320.

Memory subsystem 330 may include memory device 332 where it stores data, instructions, programs, or other items. In one embodiment, memory subsystem includes memory controller 334, which supports access to memory device 332 by processor 320. Processor 320 and memory subsystem 330 are coupled to bus/bus system 310. Bus 310 is an abstraction that represents any one or more separate physical buses, communication lines/interfaces, and/or point-to-point connections, connected by appropriate bridges, adapters, and/or controllers. Therefore, bus 310 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 310 may also correspond to interfaces in network interface 350.

System 300 may also include one or more input/output (I/O) interface(s) 340, network interface 350, one or more internal mass storage device(s) 360, and peripheral interface 370 coupled to bus 310. I/O interface 340 may include one or more interface components through which a user interacts with system 300 (e.g., video, audio, and/or alphanumeric interfacing). Network interface 350 provides system 300 the ability to communicate with remote devices (e.g., servers, other computing devices) over one or more networks. Network interface 350 may include an Ethernet adapter, wireless interconnection components, USB (universal serial bus), or other wired or wireless standards-based or proprietary interfaces.

Storage 360 may be or include any conventional medium for storing large amounts of data in a nonvolatile manner, such as one or more magnetic, solid state, or optical based disks, or a combination. Storage 360 holds code or instructions and data 362 in a persistent state (i.e., the value is retained despite interruption of power to system 300). Storage 360 may be generically considered to be a "memory," although memory 330 is the executing or operating memory to provide instructions to processor 320. Whereas storage 360 is nonvolatile, memory 330 may include volatile memory (i.e., the value or state of the data is indeterminate if power is interrupted to system 300).

Peripheral interface 370 may include any hardware interface not specifically mentioned above. Peripherals refer generally to devices that connect dependently to system 300.

A dependent connection is one where system 300 provides the software and/or hardware platform on which operation executes, and with which a user interacts.

Figure 4:
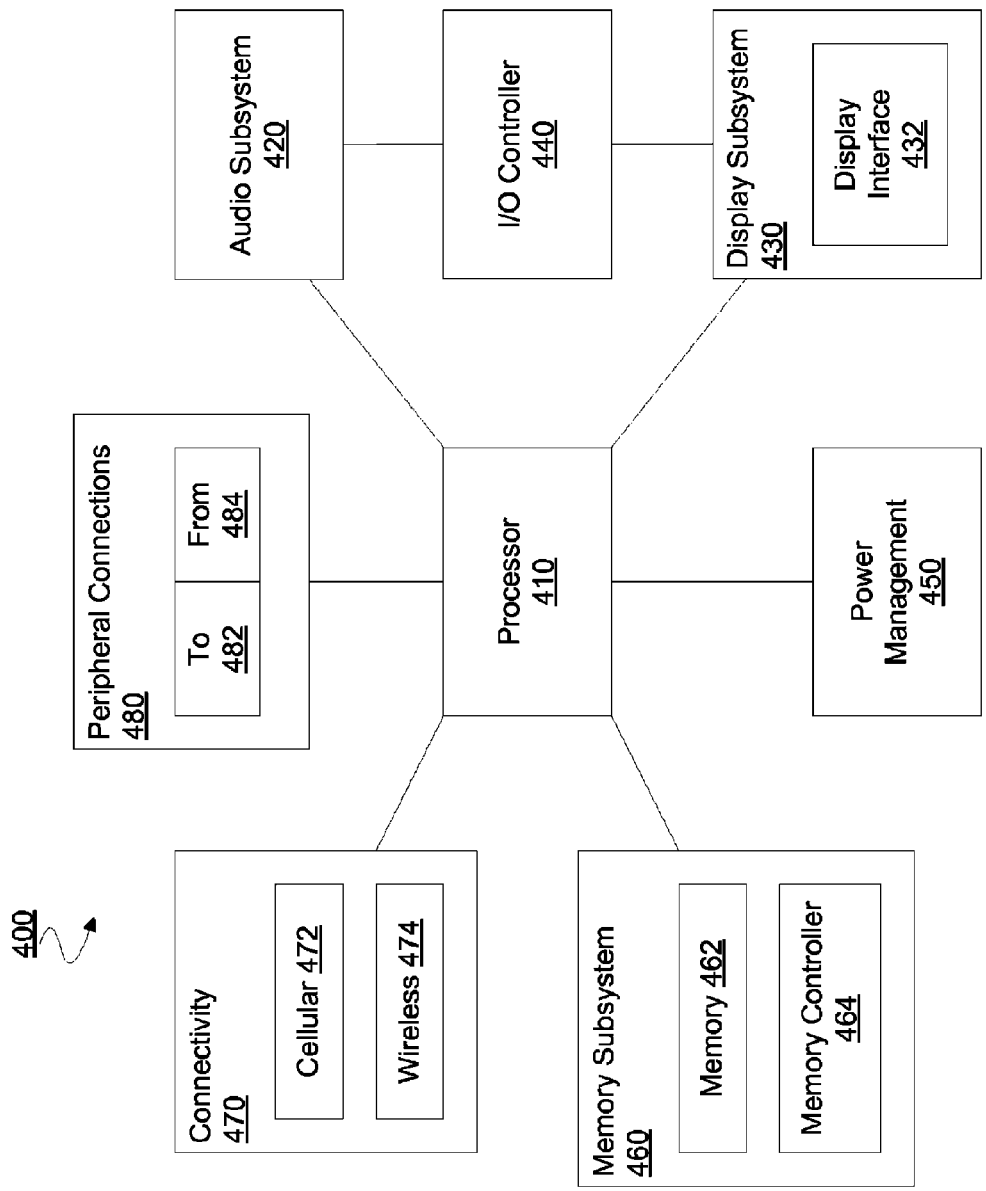
FIG. 4 is a functional block diagram illustrating elements of a mobile device for detecting an optical signal according to an embodiment.

FIG. 4 is a block diagram of an embodiment of a mobile device in which processing of an optical signal may be implemented. Device 400 represents a mobile computing device, such as a computing tablet, a mobile phone or smartphone, a wireless-enabled e-reader, or other mobile device. It will be understood that certain of the components are shown generally, and not all components of such a device are shown in device 400.

Device 400 may include processor 410, which performs the primary processing operations of device 400. Processor 410 may include one or more physical devices, such as microprocessors, application processors, microcontrollers, programmable logic devices, or other processing means. The processing operations performed by processor 410 include the execution of an operating platform or operating system on which applications and/or device functions are executed. The processing operations include operations related to I/O (input/output) with a human user or with other devices, operations related to power management, and/or operations related to connecting device 400 to another device. The processing operations may also include operations related to audio I/O and/or display I/O.

In one embodiment, device 400 includes audio subsystem 420, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 400, or connected to device 400. In one embodiment, a user interacts with device 400 by providing audio commands that are received and processed by processor 410.

Display subsystem 430 represents hardware (e.g., display devices) and software (e.g., drivers) components that provide a visual and/or tactile display for a user to interact with the computing device. Display subsystem 430 may include display interface 432, which may include the particular screen or hardware device used to provide a display to a user. In one embodiment, display interface 432 includes logic separate from processor 410 to perform at least some processing related to the display. In one embodiment, display subsystem 430 includes a touchscreen device that provides both output and input to a user.

I/O controller 440 represents hardware devices and software components related to interaction with a user. I/O controller 440 may operate to manage hardware that is part of audio subsystem 420 and/or display subsystem 430. Additionally, I/O controller 440 illustrates a connection point for additional devices that connect to device 400 through which a user might interact with the system. For example, devices that may be attached to device 400 might include microphone devices, speaker or stereo systems, video systems or other display device, keyboard or keypad devices, or other I/O devices for use with specific applications such as card readers or other devices.

As mentioned above, I/O controller 440 may interact with audio subsystem 420 and/or display subsystem 430. For example, input through a microphone or other audio device may provide input or commands for one or more applications or functions of device 400. Additionally, audio output may be provided instead of or in addition to display output. In another example, if display subsystem includes a touchscreen, the display device also acts as an input device, which may be at least partially managed by I/O controller 440. There may also be additional buttons or switches on device 400 to provide I/O functions managed by I/O controller 440.

In one embodiment, I/O controller 440 manages devices such as accelerometers, cameras, light sensors or other environmental sensors, gyroscopes, global positioning system (GPS), or other hardware that may be included in device 400. The input may be part of direct user interaction, as well as providing environmental input to the system to influence its operations (such as filtering for noise, adjusting displays for brightness detection, applying a flash for a camera, or other features).

In one embodiment, device 400 includes power management 450 that manages battery power usage, charging of the battery, and features related to power saving operation. Memory subsystem 460 may include memory device(s) 462 for storing information in device 400. Memory subsystem 460 may include nonvolatile (state does not change if power to the memory device is interrupted) and/or volatile (state is indeterminate if power to the memory device is interrupted) memory devices. Memory 460 may store application data, user data, music, photos, documents, or other data, as well as system data (whether long-term or temporary) related to the execution of the applications and functions of system 400.

In one embodiment, memory subsystem 460 includes memory controller 464 (which could also be considered part of the control of system 400, and could potentially be considered part of processor 410). Memory controller 464 may exchange communications with memory 462 via a command/address bus (not shown). In an embodiment, memory controller 464 sends commands to access data stored in (or to be stored in) memory 462.

Connectivity 470 may include hardware devices (e.g., wireless and/or wired connectors and communication hardware) and software components (e.g., drivers, protocol stacks) to enable device 400 to communicate with external devices. The device could be separate devices, such as other computing devices, wireless access points or base stations, as well as peripherals such as headsets, printers, or other devices.

Connectivity 470 may include multiple different types of connectivity. To generalize, device 400 is illustrated with cellular connectivity 472 and wireless connectivity 474. Cellular connectivity 472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 474 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 480 include hardware interfaces and connectors, as well as software components (e.g., drivers, protocol stacks) to make peripheral connections. It will be understood that device 400 could both be a peripheral device ("to" 482) to other computing devices, as well as have peripheral devices ("from" 484) connected to it. Device 400 commonly has a "docking" connector to connect to other computing devices for purposes such as managing (e.g., downloading and/or uploading, changing, synchronizing) content on device 400. Additionally, a docking connector may allow device 400 to connect to certain peripherals that allow device 400 to control content output, for example, to audiovisual or other systems.

In addition to a proprietary docking connector or other proprietary connection hardware, device 400 may make peripheral connections 480 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, a method of fabricating a semiconductor device comprises forming a monocrystalline silicon region, including growing a monocrystalline silicon epitaxy on a wafer including a buried barrier layer, and etching the monocrystalline silicon epitaxy to form a taper structure of the monocrystalline silicon region. The method further comprises disposing an oxide material on the monocrystalline silicon region to form a first oxide region adjacent to the taper structure, and forming a polycrystalline silicon region on the first oxide region. The method further comprises, after forming the polycrystalline silicon region, removing a portion from the wafer to expose the monocrystalline silicon region, the portion including the buried barrier layer, and forming a photodetector adjacent to the monocrystalline silicon region.

In an embodiment, a trench structure is formed at least in part by a recess of the first oxide region toward the polycrystalline silicon region, wherein a bottom side of the photodetector adjoins silicon disposed in the trench structure. In another embodiment, the photodetector extends to a top of the trench structure. In another embodiment, forming the monocrystalline silicon region further comprises etching one or more recesses in the wafer, wherein disposing the oxide material on the monocrystalline silicon region further forms one or more mirror structures each in a respective one of the one or more recesses. In another embodiment, the method further comprises etching the monocrystalline silicon region to form a first waveguide trench and a second waveguide trench. In another embodiment, a first distance between the first waveguide trench and the second waveguide trench at the photodiode is less than a second distance between the first waveguide trench and the second waveguide trench at the taper structure. In another embodiment, removing the portion of the wafer comprises splitting the wafer at the buried barrier layer.

In another implementation, a semiconductor device comprises a monocrystalline silicon region including a taper structure to receive light, a first buried oxide region adjacent to the taper structure at a first side of the first buried oxide region, the first buried oxide region to redirect the light toward a first end of the taper structure, a polycrystalline silicon region adjacent to the first buried oxide region at a second side of the first buried oxide region opposite the first side, and a photodetector adjacent to the monocrystalline silicon region, the photodetector coupled to receive the light via the first end and to generate an electrical signal based on the light.

In an embodiment, a trench structure is formed at least in part by a recess of the first buried oxide toward the polycrystalline silicon region, wherein a bottom side of the photodetector adjoins silicon disposed in the trench structure. In another embodiment, the photodetector extends to a top of the trench structure. In another embodiment, the semiconductor device further comprises one or more mirror structures to receive a portion of the light from the photodetector, the one or more mirror structures to reflect the portion of the light back toward the photodetector. In another embodiment, the monocrystalline silicon region has formed therein a first waveguide trench and a second waveguide trench, wherein the light is directed toward the photodetector between the first waveguide trench and the second waveguide trench. In another embodiment, a first distance between the first waveguide trench and the second waveguide trench at the photodiode is less than a second distance between the first waveguide trench and the second waveguide trench at the taper structure. In another embodiment, the photodetector comprises a Germanium photodiode. In another embodiment, the Germanium photodiode comprises a first lobe portion including p-doped Germanium, a second lobe portion including n-doped Germanium, and a neck portion between the first lobe portion and a second lobe portion, the neck portion including intrinsic Germanium.

In another implementation, a system comprises a semiconductor device including a monocrystalline silicon region including a taper structure to receive light, a first buried oxide region adjacent to the taper structure at a first side of the first buried oxide region, the first buried oxide region to redirect the light toward a first end of the taper structure, a polycrystalline silicon region adjacent to the first buried oxide region at a second side of the first buried oxide region opposite the first side, and a photodetector adjacent to the monocrystalline silicon region, the photodetector coupled to receive the light via the first end and to generate an electrical signal based on the light. The system further comprises a first device coupled to an input of the semiconductor device, the first device to generate the light, and a second device electrically coupled to the photodetector, the second device to receive and process the electrical signal.

In an embodiment, a trench structure is formed at least in part by a recess of the first buried oxide toward the polycrystalline silicon region, wherein a bottom side of the photodetector adjoins silicon disposed in the trench structure. In another embodiment, the photodetector extends to a top of the trench structure. In another embodiment, the semiconductor device further comprises one or more mirror structures to receive a portion of the light from the photodetector, the one or more mirror structures to reflect the portion of the light back toward the photodetector. In another embodiment, the monocrystalline silicon region has formed therein a first waveguide trench and a second waveguide trench, wherein the light is directed toward the photodetector between the first waveguide trench and the second waveguide trench. In another embodiment, a first distance between the first waveguide trench and the second waveguide trench at the photodiode is less than a second distance between the first waveguide trench and the second waveguide trench at the taper structure. In another embodiment, the photodetector comprises a Germanium photodiode. In another embodiment, the Germanium photodiode comprises a first lobe portion including p-doped Germanium, a second lobe portion including n-doped Germanium, and a neck portion between the first lobe portion and a second lobe portion, the neck portion including intrinsic Germanium.

Techniques and architectures for photodetection are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A semiconductor device comprising:
   a monocrystalline silicon region including a taper structure to receive light;
   a first buried oxide region adjacent to the taper structure at a first side of the first buried oxide region, the first buried oxide region to redirect the light toward a first end of the taper structure;
   a polycrystalline silicon region adjacent to the first buried oxide region at a second side of the first buried oxide region opposite the first side; and
   a photodetector adjacent to the monocrystalline silicon region, the photodetector coupled to receive the light via the first end and to generate an electrical signal based on the light, wherein a trench structure is formed at least in part by a recess of the first buried oxide toward the polycrystalline silicon region, wherein a bottom side of the photodetector adjoins silicon disposed in the trench structure.

2. The semiconductor device of claim 1, wherein the photodetector extends to a top of the trench structure.

3. The semiconductor device of claim 1, the semiconductor device further comprising one or more mirror structures to receive a portion of the light from the photodetector, the one or more mirror structures to reflect the portion of the light back toward the photodetector.

4. The semiconductor device of claim 1, the monocrystalline silicon region having formed therein a first waveguide trench and a second waveguide trench, wherein the light is directed toward the photodetector between the first waveguide trench and the second waveguide trench.

5. A semiconductor device comprising:
   a monocrystalline silicon region including a taper structure to receive light;
   a first buried oxide region adjacent to the taper structure at a first side of the first buried oxide region, the first buried oxide region to redirect the light toward a first end of the taper structure;
   a polycrystalline silicon region adjacent to the first buried oxide region at a second side of the first buried oxide region opposite the first side; and
   a photodetector adjacent to the monocrystalline silicon region, the photodetector coupled to receive the light via the first end and to generate an electrical signal based on the light;
wherein the monocrystalline silicon region has formed therein a first waveguide trench and a second waveguide trench, wherein the light is directed toward the photodetector between the first waveguide trench and the second waveguide trench; and
wherein a first distance between the first waveguide trench and the second waveguide trench at the photodiode is less than a second distance between the first waveguide trench and the second waveguide trench at the taper structure.

6. A semiconductor device comprising:
   a monocrystalline silicon region including a taper structure to receive light;

a first buried oxide region adjacent to the taper structure at a first side of the first buried oxide region, the first buried oxide region to redirect the light toward a first end of the taper structure;
a polycrystalline silicon region adjacent to the first buried oxide region at a second side of the first buried oxide region opposite the first side; and
a photodetector adjacent to the monocrystalline silicon region, the photodetector coupled to receive the light via the first end and to generate an electrical signal based on the light, wherein the photodetector comprises a Germanium photodiode, wherein the Germanium photodiode comprises:
a first lobe portion including p-doped Germanium;
a second lobe portion including n-doped Germanium; and
a neck portion between the first lobe portion and a second lobe portion, the neck portion including intrinsic Germanium.

7. A system comprising:
a semiconductor device including:
a monocrystalline silicon region including a taper structure to receive light;
a first buried oxide region adjacent to the taper structure at a first side of the first buried oxide region, the first buried oxide region to redirect the light toward a first end of the taper structure;
a polycrystalline silicon region adjacent to the first buried oxide region at a second side of the first buried oxide region opposite the first side; and
a photodetector adjacent to the monocrystalline silicon region, the photodetector coupled to receive the light via the first end and to generate an electrical signal based on the light, wherein a trench structure is formed at least in part by a recess of the first buried oxide toward the polycrystalline silicon region, wherein a bottom side of the photodetector adjoins silicon disposed in the trench structure; and
a first device coupled to an input of the semiconductor device, the first device to generate the light; and
a second device electrically coupled to the photodetector, the second device to receive and process the electrical signal.

8. The system of claim 7, wherein the photodetector extends to a top of the trench structure.

9. The system of claim 7, the semiconductor device further comprising one or more mirror structures to receive a portion of the light from the photodetector, the one or more mirror structures to reflect the portion of the light back toward the photodetector.

10. A system comprising:
a semiconductor device including:
a monocrystalline silicon region including a taper structure to receive light;
a first buried oxide region adjacent to the taper structure at a first side of the first buried oxide region, the first buried oxide region to redirect the light toward a first end of the taper structure;
a polycrystalline silicon region adjacent to the first buried oxide region at a second side of the first buried oxide region opposite the first side; and
a photodetector adjacent to the monocrystalline silicon region, the photodetector coupled to receive the light via the first end and to generate an electrical signal based on the light, wherein the monocrystalline silicon region has formed therein a first waveguide trench and a second waveguide trench, wherein the light is directed toward the photodetector between the first waveguide trench and the second waveguide trench, wherein a first distance between the first waveguide trench and the second waveguide trench at the photodiode is less than a second distance between the first waveguide trench and the second waveguide trench at the taper structure;
a first device coupled to an input of the semiconductor device, the first device to generate the light; and
a second device electrically coupled to the photodetector, the second device to receive and process the electrical signal.

11. A system comprising:
a semiconductor device including:
a monocrystalline silicon region including a taper structure to receive light;
a first buried oxide region adjacent to the taper structure at a first side of the first buried oxide region, the first buried oxide region to redirect the light toward a first end of the taper structure;
a polycrystalline silicon region adjacent to the first buried oxide region at a second side of the first buried oxide region opposite the first side; and
a photodetector adjacent to the monocrystalline silicon region, the photodetector coupled to receive the light via the first end and to generate an electrical signal based on the light, wherein the photodetector comprises a Germanium photodiode which includes:
a first lobe portion including p-doped Germanium;
a second lobe portion including n-doped Germanium; and
a neck portion between the first lobe portion and a second lobe portion, the neck portion including intrinsic Germanium;
a first device coupled to an input of the semiconductor device, the first device to generate the light; and
a second device electrically coupled to the photodetector, the second device to receive and process the electrical signal.

* * * * *